(12) United States Patent
Fujimori

(10) Patent No.: US 6,944,045 B2
(45) Date of Patent: Sep. 13, 2005

(54) DATA HOLDING APPARATUS AND DATA READ OUT METHOD

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/468,489

(22) PCT Filed: Nov. 15, 2002

(86) PCT No.: PCT/JP02/11979
§ 371 (c)(1),
(2), (4) Date: Aug. 20, 2003

(87) PCT Pub. No.: WO03/044953
PCT Pub. Date: May 30, 2003

(65) Prior Publication Data
US 2004/0071039 A1 Apr. 15, 2004

(30) Foreign Application Priority Data
Nov. 19, 2001 (JP) ........................... 2001-353848

(51) Int. Cl.[7] .............................................. G11C 11/22
(52) U.S. Cl. .................................. 365/145; 365/189.05
(58) Field of Search ............................. 365/145, 189.05

(56) References Cited

U.S. PATENT DOCUMENTS

5,274,583 A * 12/1993 Rapp ........................... 708/823
5,592,411 A    1/1997 Tai ............................... 365/145
5,936,879 A *  8/1999 Brouwer et al. ............. 365/145

FOREIGN PATENT DOCUMENTS

JP    2000-077982    3/2000
JP    2000-124776    4/2000

* cited by examiner

Primary Examiner—M. Tran
(74) Attorney, Agent, or Firm—Hogan & Hartson LLP

(57) ABSTRACT

A data holding device is provided that is capable of holding data even if the power supply is shut off and reliability in holding data is high. The data holding device 1 is provided with a data latch circuit 3 and a ferroelectric memory section 5. Ferroelectric capacitors 17 and 19 are capable of storing data in non-volatile manner. One end of the ferroelectric capacitor 17 is connected to the input node 7a of an inverter circuit 7 through a transfer gate 11. The transfer gate 11 is in the off state when data are passed. Therefore, even if input data D changes when data are passed, the change is quickly transmitted to the input node 7a, so that reliability of latching operation does not lower even if the operation is made at usual speeds.

20 Claims, 13 Drawing Sheets

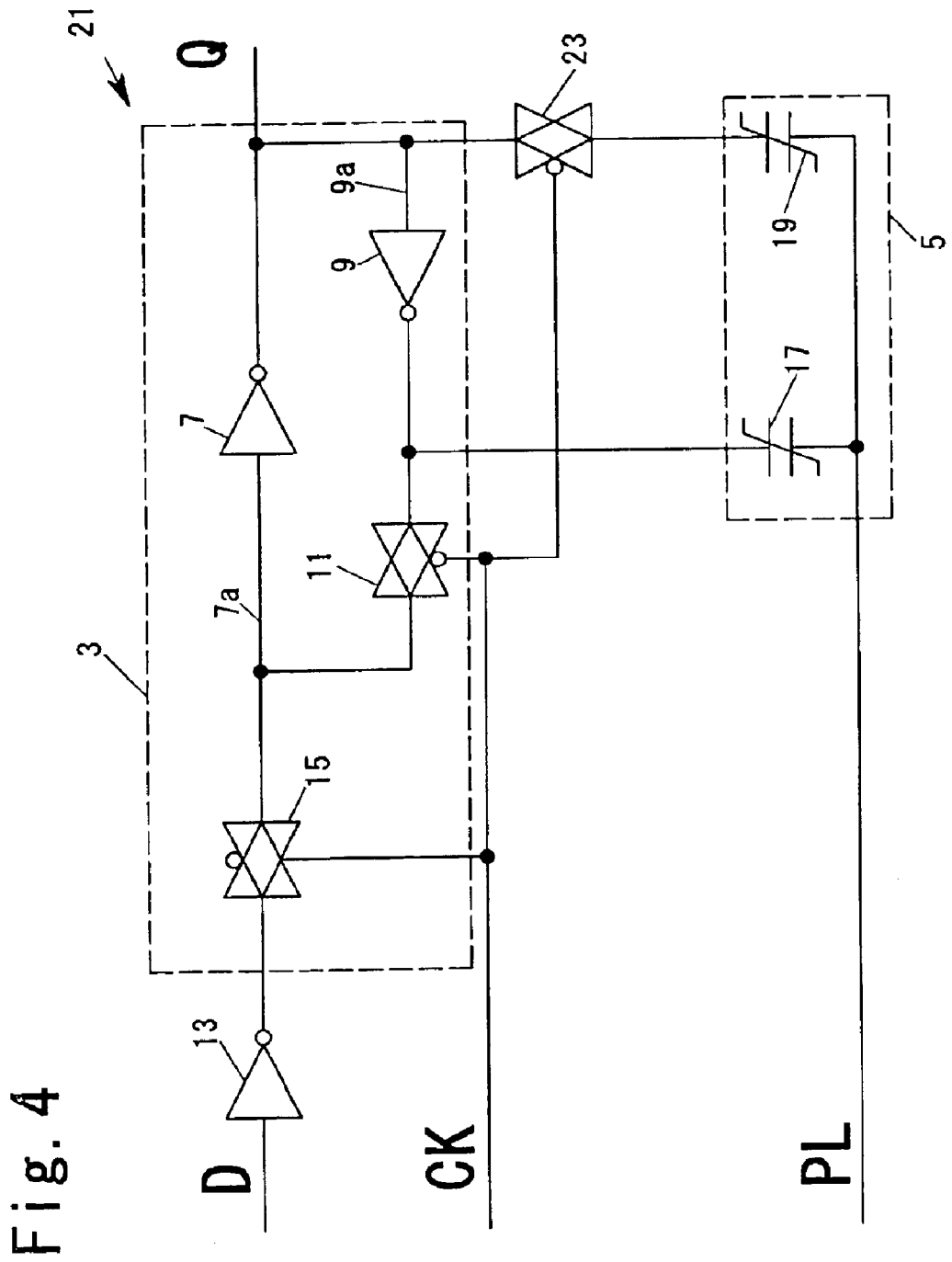

DATA HOLDING APPARATUS AND DATA READ OUT METHOD

CROSS-REFERENCE TO RELATED APPLICATIONS

The entire disclosure of a Japanese patent application No. 2001-353848 filed on Nov. 19, 2001 including its specification, claims, drawings, and summary is incorporated herein by reference.

TECHNICAL FIELD

The present invention relates to a data holding device and a data reading method.

BACKGROUND ART

As a data holding circuit for use in the sequential circuit such as the latch circuit, a circuit made by for example connecting two inverter circuits in a series loop is known. Such a data holding circuit, however, usually can hold data only in volatile manner, and so the data are lost when power supply is stopped. That is to say, even if the power supply is resumed, the previous data cannot be restored.

Therefore, for example when a sequential process using such a sequential circuit must be suspended for any reason, the power supply must be maintained to hold the data. Accordingly electric power is consumed. In the case the sequential process is interrupted due to power failure or the like, the process must be redone from scratch, incurring much loss of time.

To solve such a problem, a circuit 901 shown in FIG. 11 using a ferroelectric capacitor has been proposed. With the circuit 901, input data D are latched with a data latch circuit 902 by a fall of a clock pulse CK.

When a writing signal is given to the plate line PL in the state of the data latched, paired ferroelectric capacitors 911 and 913 are respectively set to a polarized state corresponding to the latched data. Even if the power supply is shut off thereafter, residual polarization corresponding to the data is held with the ferroelectric capacitors 911 and 913.

After that, first, when a reading signal is given to the plate line PL before resuming power supply, a voltage corresponding to the residual polarization held is produced at one ends 911a and 913a of the ferroelectric capacitors 911 and 913. After that, when power supply is resumed, the previous data based on the produced voltage are restored with the data latch circuit 902. In this way, the data before the stop of power supply are restored.

However, the above circuit 901 has problems as described below. When the clock pulse CK is "H," while the input data D are inputted to the data latch circuit 902, the potential of the input node 907a of the inverter circuit 907 does not change immediately because one end 911a of the ferroelectric capacitor 911 is connected to the input node 907a of the inverter circuit 907.

Therefore, if the frequency of the clock pulse CK is high, it is hard to accurately latch the input data D. This makes it hard to use such a circuit in devices that are required to function at high speeds.

Another problem associated with the above circuit 901 is as follows. As for the p-MOSFET (p channel MOSFET) 915 constituting an inverter circuit, such as an inverter circuit 909, contained in the data latch circuit 902, as shown in FIGS. 12A and 12B, its well region 919, together with the source region 921, is connected to the power supply line VDD.

That is to say, the well region 919 before resuming power supply is like the source region 921 in the state of high impedance. Therefore, even if a large amount of electric charge is released from one end 911a of the ferroelectric capacitor 911 by giving a reading signal to the plate line PL before resuming the power supply, most of it ends up in moving from the drain region 923 through the PN junction 920 to the well region 919.

As a result, as shown FIG. 13, when a reading signal is given to the plate line PL, the difference between the voltage V1 produced at the one end 911a of the ferroelectric capacitor 911 when the ferroelectric capacitor 911 is inverted by polarization (for example corresponding to the data "H") and the voltage V2 produced at the one end 911a of the ferroelectric capacitor 911 when the ferroelectric capacitor 911 is not inverted by polarization (for example corresponding to the data "L") is not so large.

In other words, detection margin when data are restored by resuming power supply is small and so the reliability of restored data is low.

DISCLOSURE OF THE INVENTION

The object of this invention is to eliminate the above problems associated with the conventional data holding circuits by providing a data holding device and a data reading method capable of holding data even if power supply is shut off, and highly reliable in holding data at high speeds. Another object of this invention is to provide a data holding device and a data reading method capable of holding data even if power supply is shut off, and highly reliable in data restoration after resuming power supply. That is to say, the object of this invention is to provide a data holding device and a data reading method capable of holding data even if power supply is shut off, and highly reliable in holding data.

The data holding device according to the present invention is the one with a data holding circuit made to be capable of holding data by interconnecting, in a series loop, an inverter circuit disposed in a main signal path and an inverter circuit disposed in a feedback path, comprising: a first on-off gate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to the output node of the inverter circuit disposed in the feedback path; wherein a polarized state corresponding to the data held in the data holding circuit is memorized in the first ferroelectric capacitor by giving a writing signal to the other end of the first ferroelectric capacitor; and wherein the data corresponding to the polarized state memorized in the first ferroelectric capacitor is restored in the data holding circuit by giving a reading signal to the other end.

The data holding device according to the present invention is the one comprising: a data storing circuit for releasing an amount of electric charge commensurate with stored data to an electric charge releasing node when a reading signal is given; a data restoring circuit for restoring contents of the data stored in the data storing circuit on the basis of a voltage produced at the electric charge releasing node with the released electric charge; and a field effect transistor having a drain region connected substantially to the electric charge releasing node and having a junction with its joining direction from the drain region to a base semiconductor region of the field effect transistor in agreement with a direction of the electric charge released; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

The data holding device according to the present invention is the one having a data holding circuit made to be capable of holding data by interconnecting, in a series loop, an inverter circuit disposed in a main signal path and an inverter circuit disposed in a feedback path, comprising: a first on-off gate disposed between the output node of the inverter circuit disposed in the feedback path and the input node of the inverter circuit disposed in the main signal path, the first on-off gate being on-off-controlled to become on state when data is held and to become off state when data is passed, and a first ferroelectric capacitor having its one end connected to the output node of the inverter circuit disposed in the feedback path, wherein the first ferroelectric capacitor is adapted to memorize the polarized state corresponding to the data present in the data holding circuit on the basis of the potential at the other end relative to the potential at one end of the first ferroelectric capacitor; and wherein the data holding circuit is adapted to restore the data corresponding to the polarized state stored in the first ferroelectric capacitor into the data holding circuit by giving a reading signal to the other end.

The method for reading data, according to the present invention, is one, using a data holding device having a data storing circuit for releasing an amount of electric charge commensurate with stored data to an electric charge releasing node when a reading signal is given; a data restoring circuit for restoring contents of the data stored in the data storing circuit on the basis of a voltage produced at the electric charge releasing node with the released electric charge; and a field effect transistor having a drain region connected substantially to the electric charge releasing node and having a junction with its joining direction from the drain region to a base semiconductor region of the field effect transistor in agreement with a direction of the electric charge released; the method comprising: starting to give a voltage substantially the same as a source voltage that is to be given to a source region of the field effect transistor, to the base semiconductor region either simultaneously with or before giving a reading signal to the data storing circuit; and giving the source voltage to the source region after giving the reading signal, to the data storing circuit.

While the features of the present invention may be broadly described above, its constitution and contents together with its objects will become more apparent with the following disclosure in reference to the appended drawings.

BRIEF DESCRIPTION OF THE DRAWINGS

FIG. 4 is a circuit diagram showing a data holding device 21 as another embodiment of the present invention.

BEST MODE FOR CARRYING OUT THE INVENTION

Figure 1:
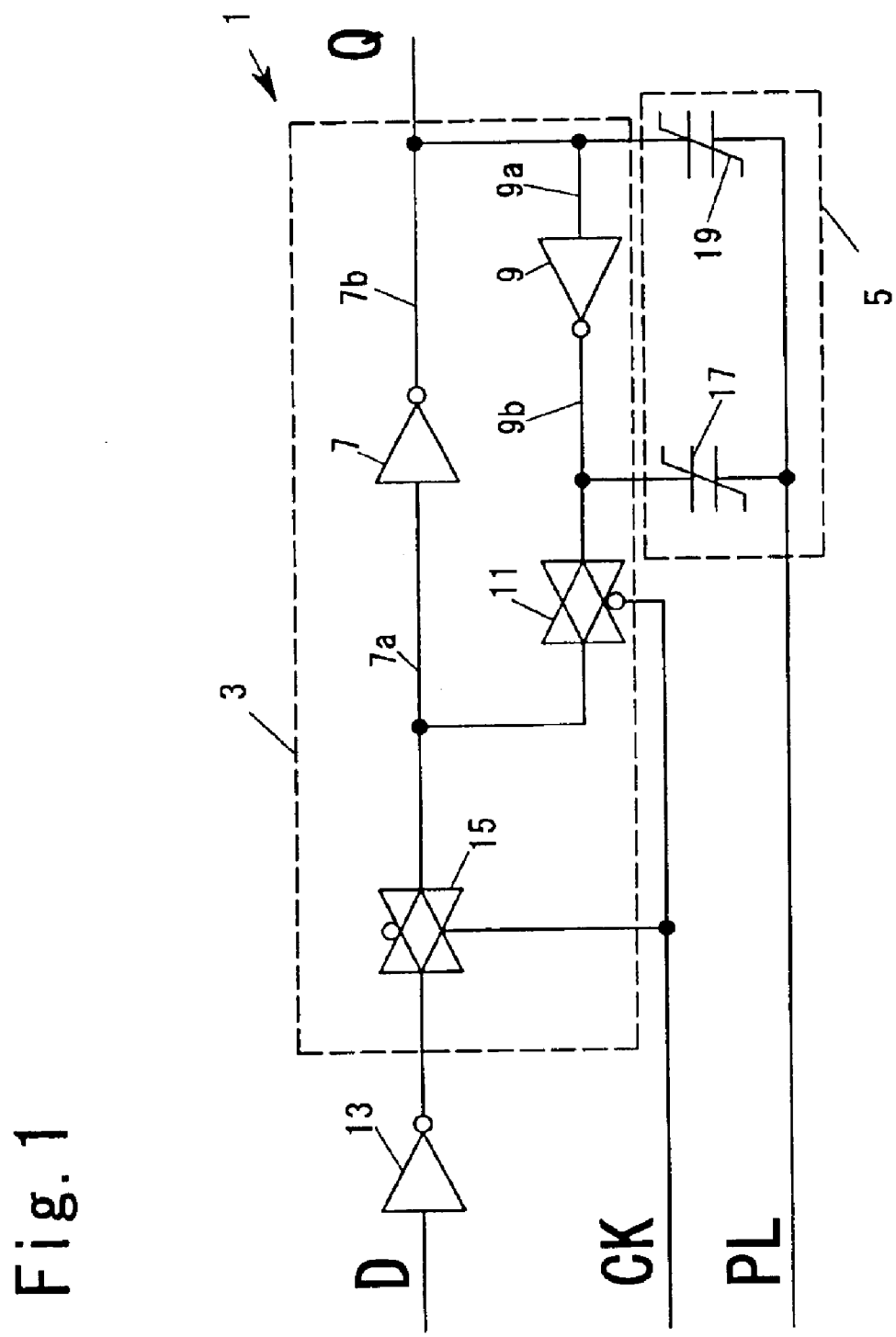
FIG. 1 is a circuit diagram of a data holding device 1 as an embodiment of the present invention.

FIG. 1 is a circuit diagram of a data holding device 1 as a first embodiment of the present invention. The data holding device 1 comprises a data latch circuit 3 as a data holding circuit and a ferroelectric storage section 5.

The data latch circuit 3 has a pair of inverter circuits 7 and 9 that can be interconnected to form a series loop. The output node 9b of the inverter circuit 9 disposed in the feedback path is connected to the input node 7a of the inverter circuit 7 disposed in the main signal path through the first on-off gate, a transfer gate 11.

The transfer gate 11 is controlled with clock pulses CK given to a clock signal line CK. That is to say, the transfer gate 11 is on-off-controlled with the clock pulses CK to be on when holding data and to be off when passing data. The output node 7b of the inverter circuit 7 is directly connected to the input node 9a of the inverter circuit 9.

In this embodiment, the transfer gate is made up of an n-MOSFET (n-MOS type of field effect transistor) and a p-MOSFET (p-MOS type of field effect transistor), and the clock pulses CK are applied to the gate of either one of the two transistors. Though not shown, inverted pulses of the clock pulses CK are applied to the gate of the other transistor. Unless specifically mentioned in the following description, other transfer gates are assumed to be of the same constitution.

The data D given (input data D) to the data input line D is given to the input node 7a of the inverter circuit 7 through the inverter circuit 13 and the transfer gate 15. The transfer gate 15 is controlled with the clock pulses CK. The output node 7b is connected to the data output line Q for outputting output data Q.

The ferroelectric storage section 5 is made up of ferroelectric capacitors 17 and 19 respectively as the first and second ferroelectric capacitors. The one-side ends of the ferroelectric capacitors 17 and 19 are respectively connected to the output node 9b and the input node 9a of the inverter circuit 9. The other side ends of the ferroelectric capacitors 17 and 19 are both connected to the reading signal line, the plate line PL.

The ferroelectric capacitors 17 and 19 are caused to store the polarized state corresponding to the data held in the data latch circuit 3 with a writing signal given through the plate line PL to the other side ends of the ferroelectric capacitors 17 and 19. It is constituted to restore the data corresponding to the polarized state stored in the ferroelectric capacitors 17 and 19 in the data latch circuit 3 by giving a reading signal to the other side ends through the plate line PL when resuming power supply to the data holding device 1.

Figure 2:
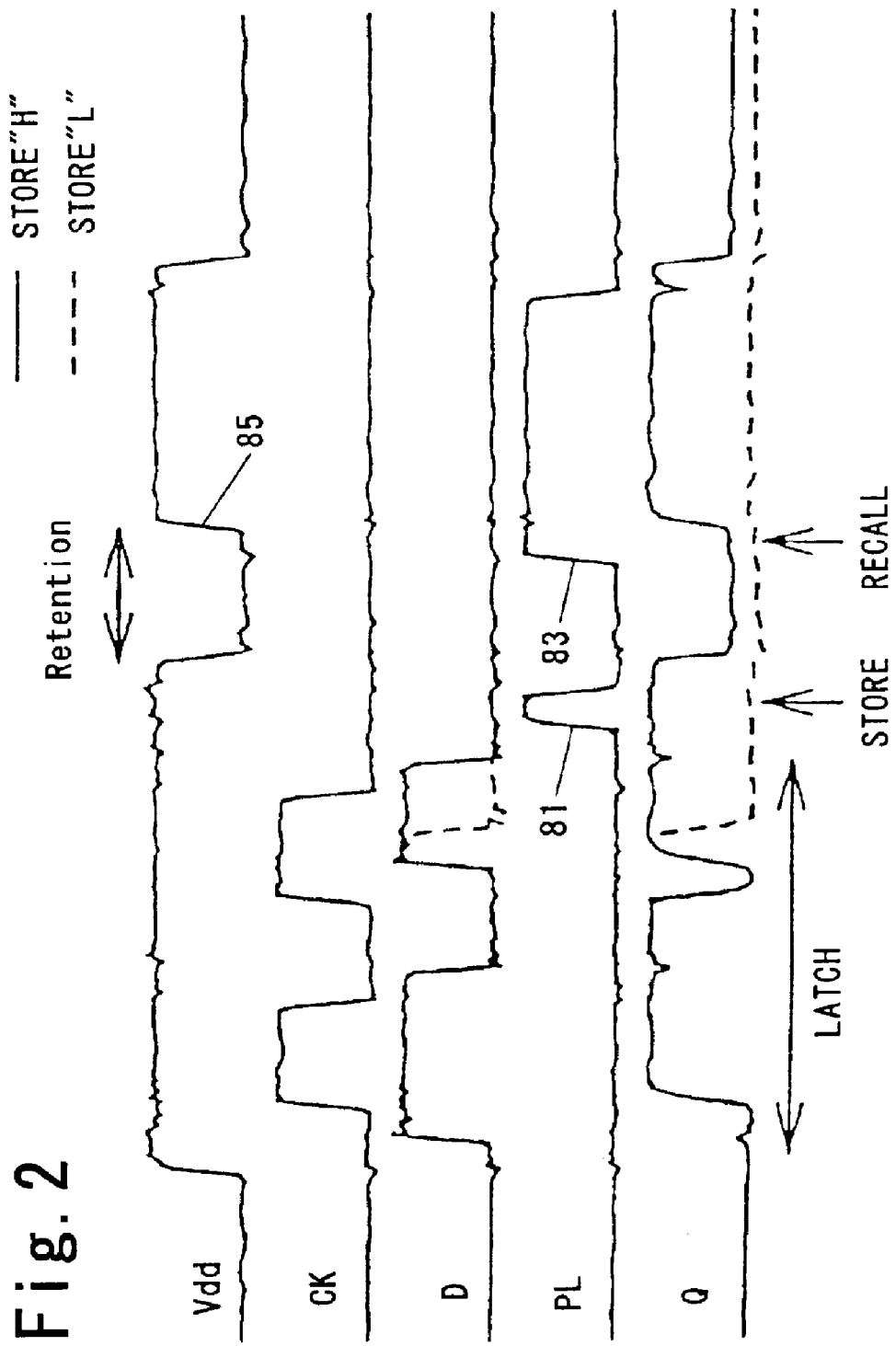
FIG. 2 is a timing chart for explaining the function of the data holding device 1 shown in FIG. 1.
Figure 3A:
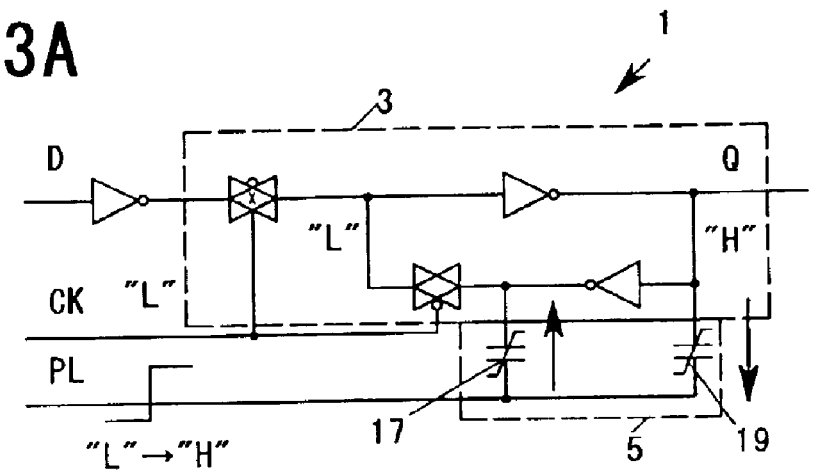
FIG. 3A is a drawing for explaining the function of storing data in a ferroelectric storage section 5.
Figure 3B:
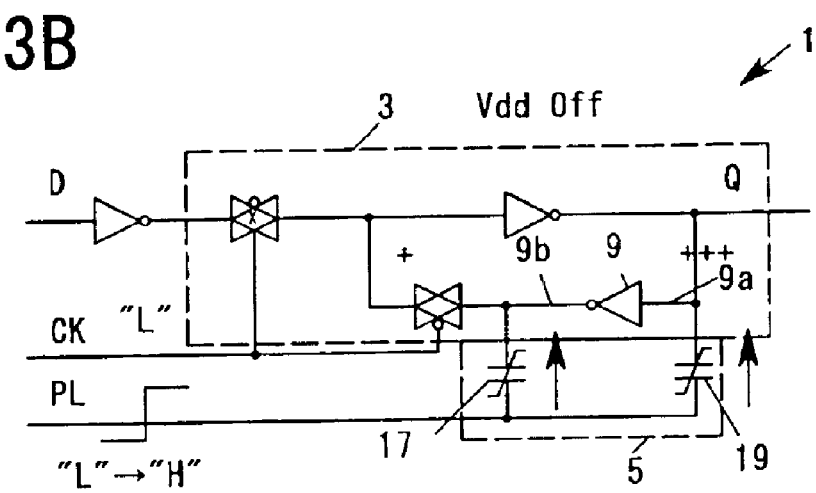
FIGS. 3B to 3C are drawings for explaining the function of restoring data from the ferroelectric storage section 5.
Figure 3C:
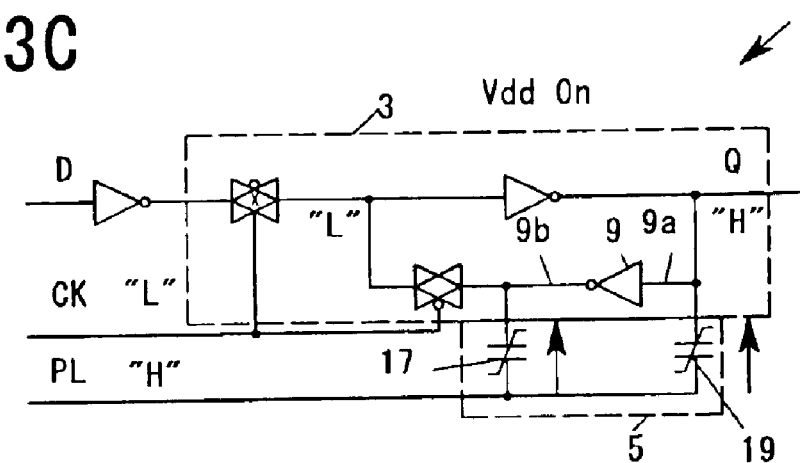

FIG. 2 is a timing chart for explaining the function of the data holding device 1 shown in FIG. 1. FIG. 3A is a drawing for explaining the function of storing data in the ferroelectric storage section 5. FIGS. 3B to 3C are drawings for explaining the function of restoring data from the ferroelectric storage section 5. The functions of the data holding device 1 are described in reference to FIGS. 1, 2, and 3A to 3C.

As shown in FIG. 1, the input data D inputted through the data input line D are inverted with the inverter circuit 13 and re-inverted with the inverter circuit 7 and becomes output data Q as it is while the clock signal line CK remains "H." Since the transfer gate 11 is in the off state while the clock pulse CK remains "H," influence of the ferroelectric capacitor 17 on the main signal path is eliminated.

Therefore, when the input data D changes, the potential of the input node 7a of the inventor circuit 7 disposed in the main signal path changes quickly without being affected with the capacitance of the ferroelectric capacitor 17. Namely, reduction in the operation speed is restricted.

Since the transfer gate 11 also has the function of preventing concurrence of the input data D and the feedback signal from the inverter circuit 9 at the input node 7a of the inverter circuit 7, the data holding device 1 of a high performance may be provided with a small number of components.

Since the clock pulse CK for switching between the data holding state and the data passing state may be used as the signal for on-off-controlling the transfer gate 11, no dedicated signal need to be produced and so the circuit constitution of the data holding device 1 as a whole may be simplified.

Since the polarized state of the ferroelectric capacitor 17 does not change even if the input data changes when data are passed, deterioration of the ferroelectric capacitor 17 due to the change in the polarized state is restricted.

Referring back to FIG. 2 again, the input data D given to the data input line D is latched by the fall of the clock pulse CK given to the clock signal line CK and held in the data latch circuit 3 while the clock pulse CK remains at the "L" level. In ordinary operation as shown in FIG. 2, the plate line PL is kept at the ground potential GND.

Incidentally, for both the input data D and the output data Q, the "H" level data are equal to the power supply voltage VDD and the "L" level data are equal to the ground potential GND.

Before shutting off the power supply voltage VDD applied to the power supply line VDD, the clock pulse CK is fixed to "L" and then a writing signal 81 is given to the plate line PL. The writing signal 81 is a pulse signal of which the bottom potential is the ground potential GND and the top potential is the power supply voltage VDD.

It is assumed that the data held in the data latch circuit 3 (equal to the output data Q) is "H" for example and a writing signal 81 is given to the plate line PL. Then, as shown in FIG. 3A, a polarized state directed upward as seen in the figure appears at the ferroelectric capacitor 17 and a polarized state directed downward as seen in the figure appears at the ferroelectric capacitor 19.

After giving the writing signal 81 to the plate line PL, the power supply voltage VDD is shut off as shown in FIG. 2.

Even if the power supply voltage VDD is shut off, the ferroelectric capacitors 17 and 19 hold residual polarization corresponding to the respective directions of polarization.

Before re-applying the power supply voltage VDD, the clock pulse CK is held at "L" and then a reading signal 83 is given to the plate line PL. The reading signal 83 is a pulse signal of which the bottom potential is the ground potential GND and the top potential is the power supply voltage VDD. This pulse signal is substantially longer than the writing signal 81.

When a reading signal 83 is given to the plate line PL, as shown in FIG. 3B, inversion of polarization does not occur in the ferroelectric capacitor 17 but it occurs in the ferroelectric capacitor 19. Therefore, the amount of electric charge released to the input node 9a of the inverter circuit 9 of the data latch circuit 3 is greater than that released to the output node 9b.

Next, the power supply voltage VDD is applied again (See 85 of FIG. 2) while maintaining the writing signal 83 on the plate line PL. By the re-application of the power supply voltage VDD, logic value of the data latch circuit 3 is determined according to the amounts of electric charge released to the input node 9a and to the output node 9b.

That is to say, as shown in FIG. 3C, the logic values of the data latch circuit 3 are determined to be "H" on the input node 9a side, and "L" on the output node 9b side of the inverter circuit 9 of the data latch circuit 3. Thus, the data are restored.

In this way, concurrence of the electric charge released from the ferroelectric capacitor 17 and the output from the inverter circuit 9 may be prevented by giving a reading signal 83 to the plate line PL, followed by re-applying the power supply voltage VDD. Also, concurrence of the electric charge released from the ferroelectric capacitor 19 and the output from the inverter circuit 7 may be prevented. Therefore, reliability in data restoration is enhanced.

Incidentally, while this embodiment is arranged to employ a pair of ferroelectric capacitors 17 and 19 to form the ferroelectric storage section 5, the present invention is not limited to the arrangement. For example, an arrangement may be made using only the ferroelectric capacitor 17 as the ferroelectric storage section 5.

Next, FIG. 4 is a circuit diagram showing a data holding device 21 as another embodiment of the present invention. The data holding device 21 is constituted in the same way as the data holding device 1 shown in FIG. 1 except that a second on-off gate, a transfer gate 23, is interposed between the one-side end of the ferroelectric capacitor 19 and the input node 9a of the inverter circuit 9.

The transfer gate 23 is on-off-controlled with the clock pulses CK, like the transfer gate 11, to be on when holding data and off when passing data.

Provision of the transfer gate 23, when passing data, sets the input node 9a of the inverter circuit 9 and the ferroelectric capacitor 19 disposed on the feedback path to a mutually disconnected state. Therefore, the output from the inverter circuit 7 disposed on the main signal path reaches quickly the input node 9a of the inverter circuit 9 disposed on the feedback path. As a result, data may be determined quickly when shifting from the data passage state to the data holding state.

While the above embodiments are explained as examples using the transfer gate as the first and second on-off gates, the first and second on-off gates are not limited to the above but a single transistor such as an FET may be used as the first or second on-off gate.

Also while the above embodiments are described as examples using a kind of sequential circuit, a data latch circuit, as a data holding circuit, the present invention is not limited to the above but other sequential circuit such as a flip-flop circuit or the like may also be used in the present invention.

Figure 5:
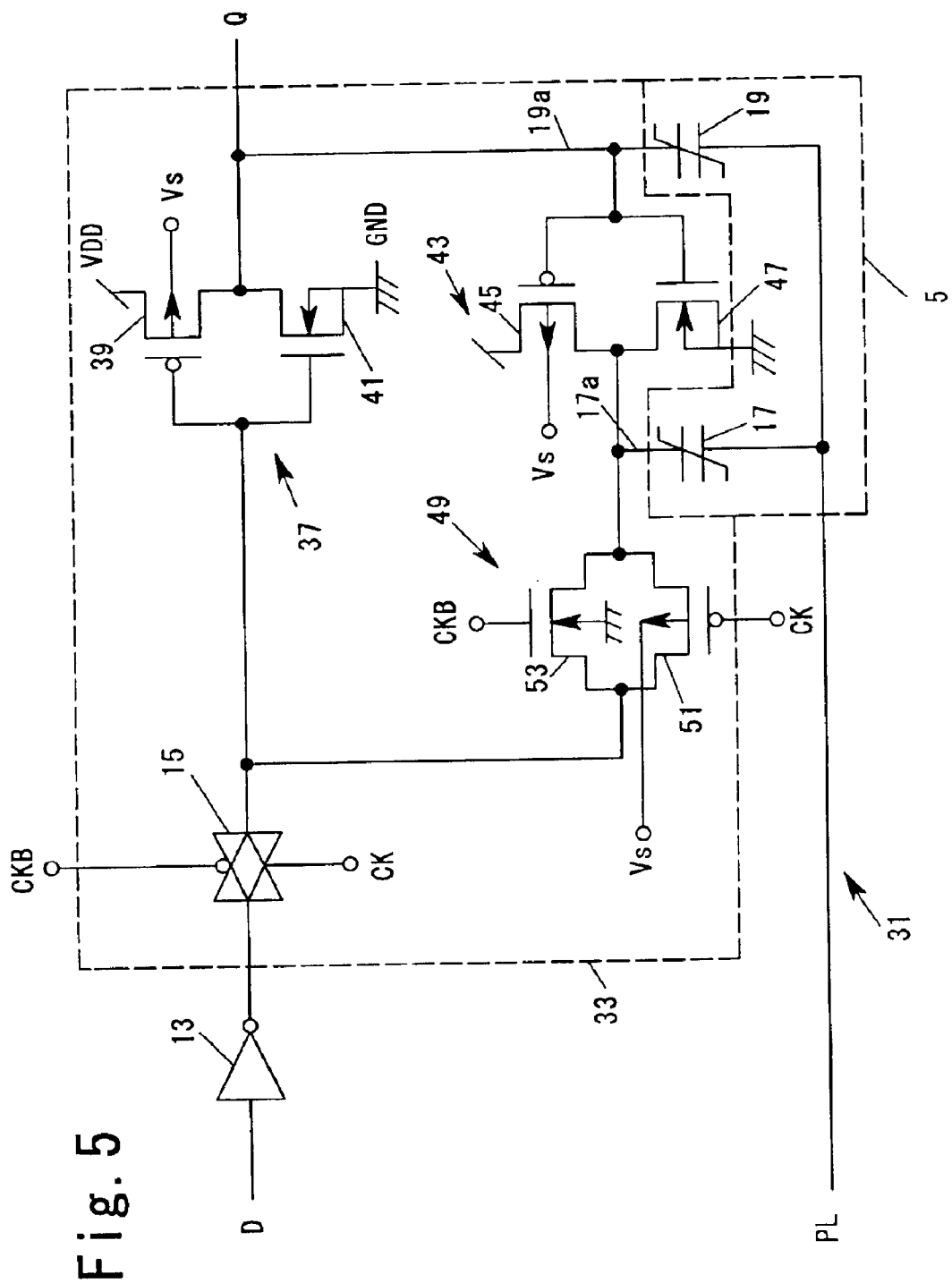
FIG. 5 is a circuit diagram showing a data holding device 31 as still another embodiment of the present invention.

FIG. 5 is a circuit diagram showing a data holding device 31 as still another embodiment of the present invention. The data holding device 31 is similar to the data holding device 1 shown in FIG. 1 but differs in the constitutions of the transfer gate 49 and paired inverter circuits 37, 43 included in the data latch circuit 33.

That is, in the data holding device 1, the well regions of the p-MOSFETs (p-channel MOSFETs) respectively constituting the inverter circuits 7, 9, and the transfer gate 11 are connected to the power supply line VDD. In the data holding device 31, however, the well regions (base semiconductor regions) of the p-MOSFETs (p-channel MOSFETs) 39,45 and 51 respectively constituting the inverter circuits 37, 43, and the transfer gate 49 are connected to the well voltage control line Vs.

Incidentally, the substrate regions (base semiconductor regions) of the n-MOSFETs (n-channel MOSFETs) 41, 47, and 53 respectively constituting the inverter circuits 37, 43, and transfer gate 49 of the data holding device 31, like the data holding device 1 shown in FIG. 1, are connected to the ground line GND. Otherwise, the data holding device 31 is constituted like the data holding device 1.

Figure 6:
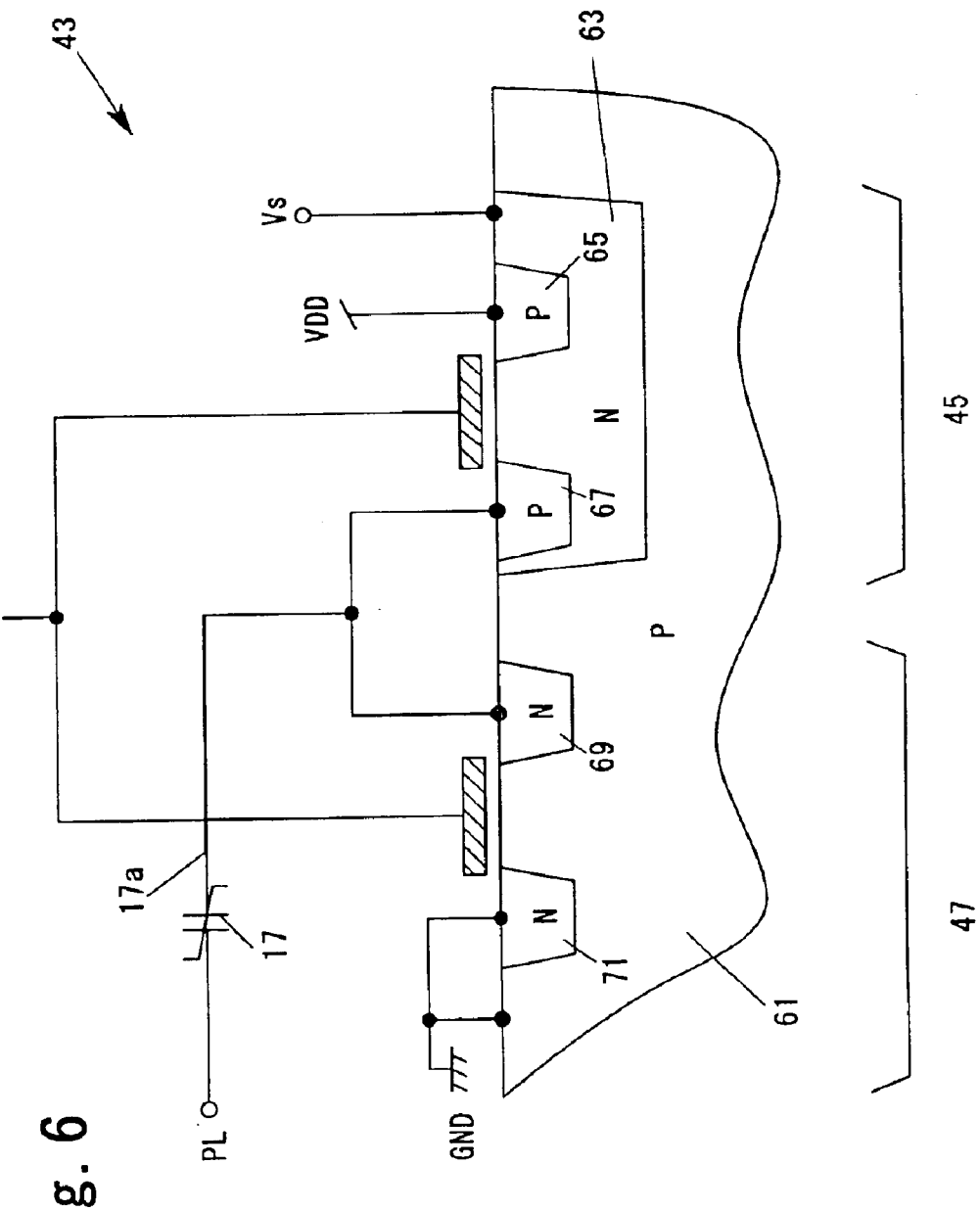
FIG. 6 is a schematic view in real shape of an inverter circuit 43.

In the data holding device 31, the ferroelectric capacitors 17 and 19 respectively correspond to data storing circuits. When the ferroelectric capacitor 17 is deemed to correspond to the data storing circuit, the inverter circuit 37 corresponds to the first inverter circuit (data restoring circuit) and the inverter circuit 43 corresponds to the second inverter circuit, and the p-MOSFET 45 of the inverter circuit 43 corresponds to the field effect transistor. FIG. 6 is a schematic view in actual form of the inverter circuit 43.

On the other hand, when the ferroelectric capacitor 19 is deemed to correspond to the data storing circuit, the inverter circuit 43 corresponds to the first inverter circuit (data restoring circuit) and the inverter circuit 37 corresponds to the second inverter circuit, and the p-MOSFET 39 of the inverter circuit 37 corresponds to the field effect transistor.

Figure 7:
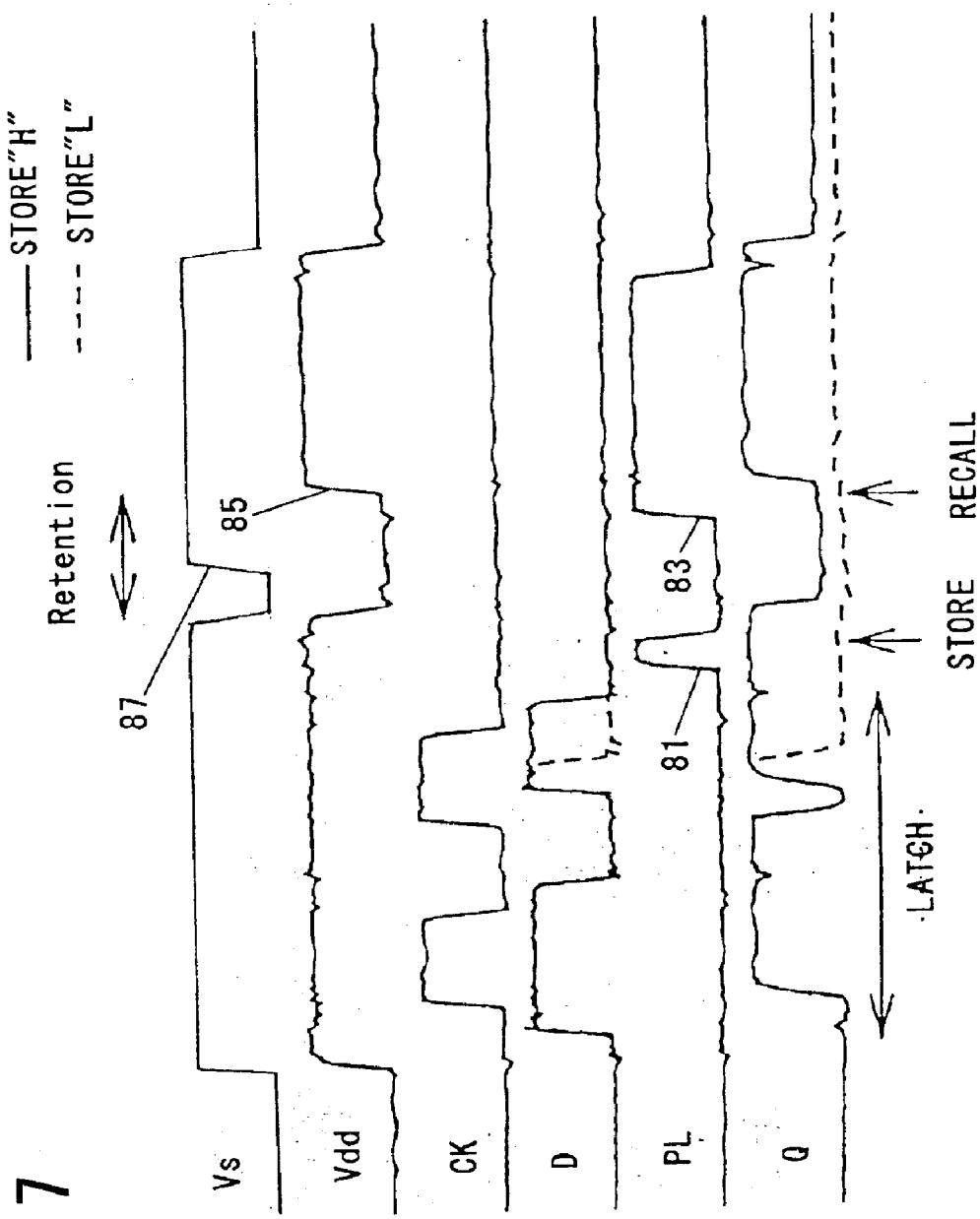
FIG. 7 is a timing chart for explaining the function of the data holding device 31 shown in FIG. 5.

FIG. 7 is a timing chart for explaining the function of the data holding device 31 shown in FIG. 5. The function of the data holding device 31 is similar to that of the data holding device 1 shown in the timing chart of FIG. 2, except for the following points.

That is to say, in the data holding device 31, the well voltage control line Vs is controlled separately from the power source VDD. It is arranged that the power supply voltage VDD may be given as the "H" level voltage and the ground potential GND may be given as the "L" level voltage to the well voltage control line Vs.

In ordinary operation, the power supply voltage VDD is supplied to the well voltage control line Vs. It is also constituted that, if the power supply to the power source line VDD is stopped, the power supply to the well voltage control line Vs is also stopped.

With the data holding device 31, when the power supply once stopped is resumed, application of the power supply voltage VDD to the well regions (See 63 in FIG. 6) of the p-MOSFETs 39, 45, and 51 (See 87 in FIG. 7) is started before applying reading signals to the ferroelectric capacitors 17 and 19 (See 83 in FIG. 7).

It is arranged that the power supply voltage VDD (source voltage) is applied to the source regions of the p-MOSFETs 39 and 45 (See 65 of FIG. 6) after giving a reading signal to the ferroelectric capacitors 17 and 19. Other functions are the same as those of the data holding device 1.

As described above, since the data holding device 31 is arranged to start giving the power supply voltage VDD to the well regions of the p-MOSFETs 39, 45 and 51 before giving a reading signal to the ferroelectric capacitors 17 and 19, the power supply voltage VDD is already given to the well regions of the p-MOSFETs 39, 45 and 51 when electric charge is released along with application of the reading signal to the ferroelectric capacitors 17 and 19.

Therefore, as shown in FIG. 6, since the power supply voltage VDD is given to the well region 63 of the p-MOSFET 45 for example, the electric charge released to one end 17a of the ferroelectric capacitor 17 does not flow out through the drain region 67 of the p-MOSFET 45 to the well region 63. Therefore, the released electric charge is accumulated as it is at one end 17a of the ferroelectric capacitor 17, and a voltage corresponding to the accumulated electric charge is produced.

Figure 8:
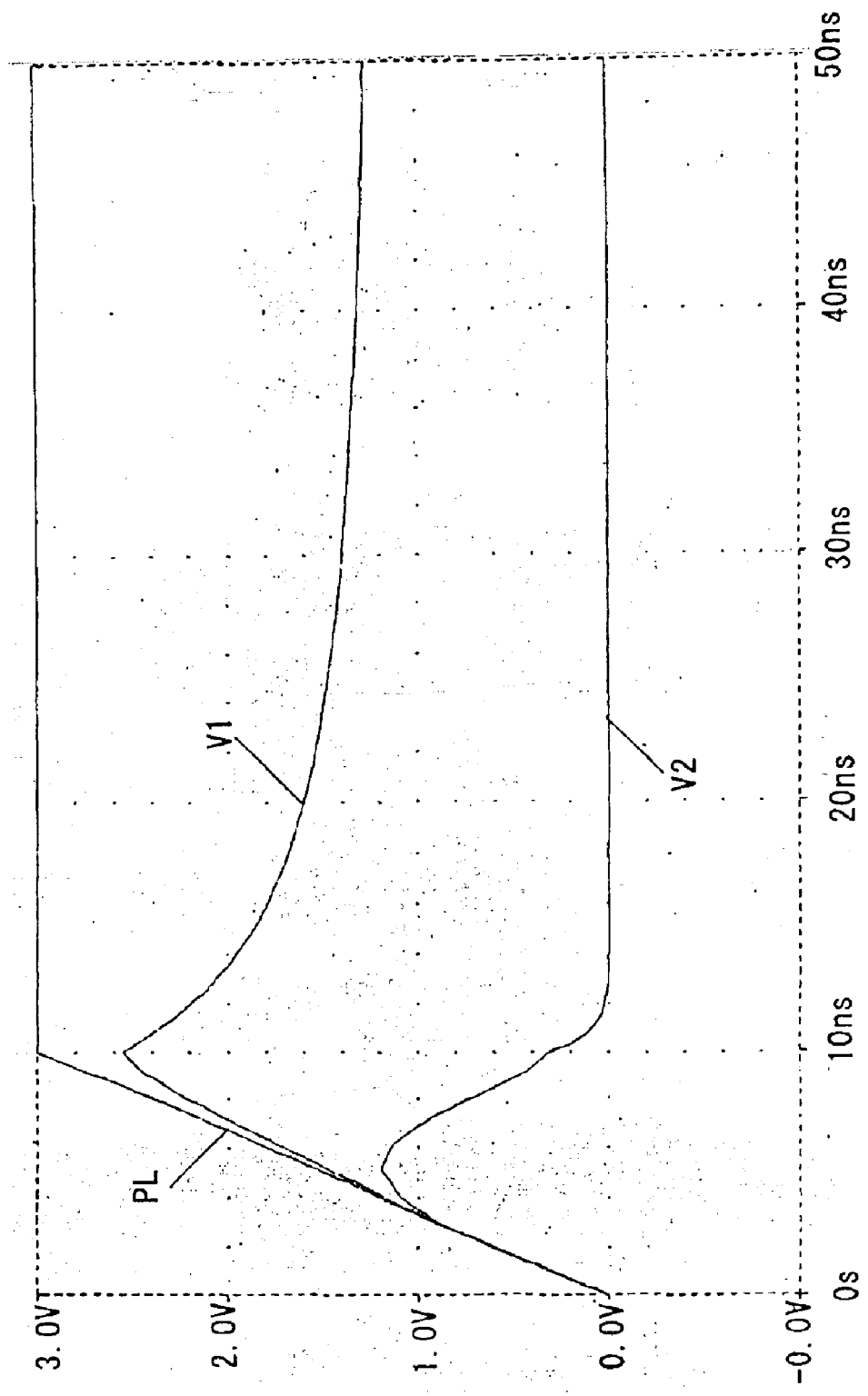
FIG. 8 shows voltages V1 and V2 produced at one end 17a of a ferroelectric capacitor 17 when data are read with the data holding device 31.

FIG. 8 shows a graph of voltages V1 and V2 produced at one end 17a of the ferroelectric capacitor 17 when a reading signal 83 is applied to the plate line PL of the data holding device 31. It is assumed that the voltage V1 is produced when inverse polarization occurs at the ferroelectric capacitor 17 by the application of the reading signal 83 (for example corresponding to data "H"), and the voltage V2 is produced when no inverse polarization occurs at the ferroelectric capacitor 17 by the application of the reading signal 83 (for example corresponding to data "L"). The vertical axis of the graph represents the voltage and the horizontal axis represents elapsed time.

Figure 13:
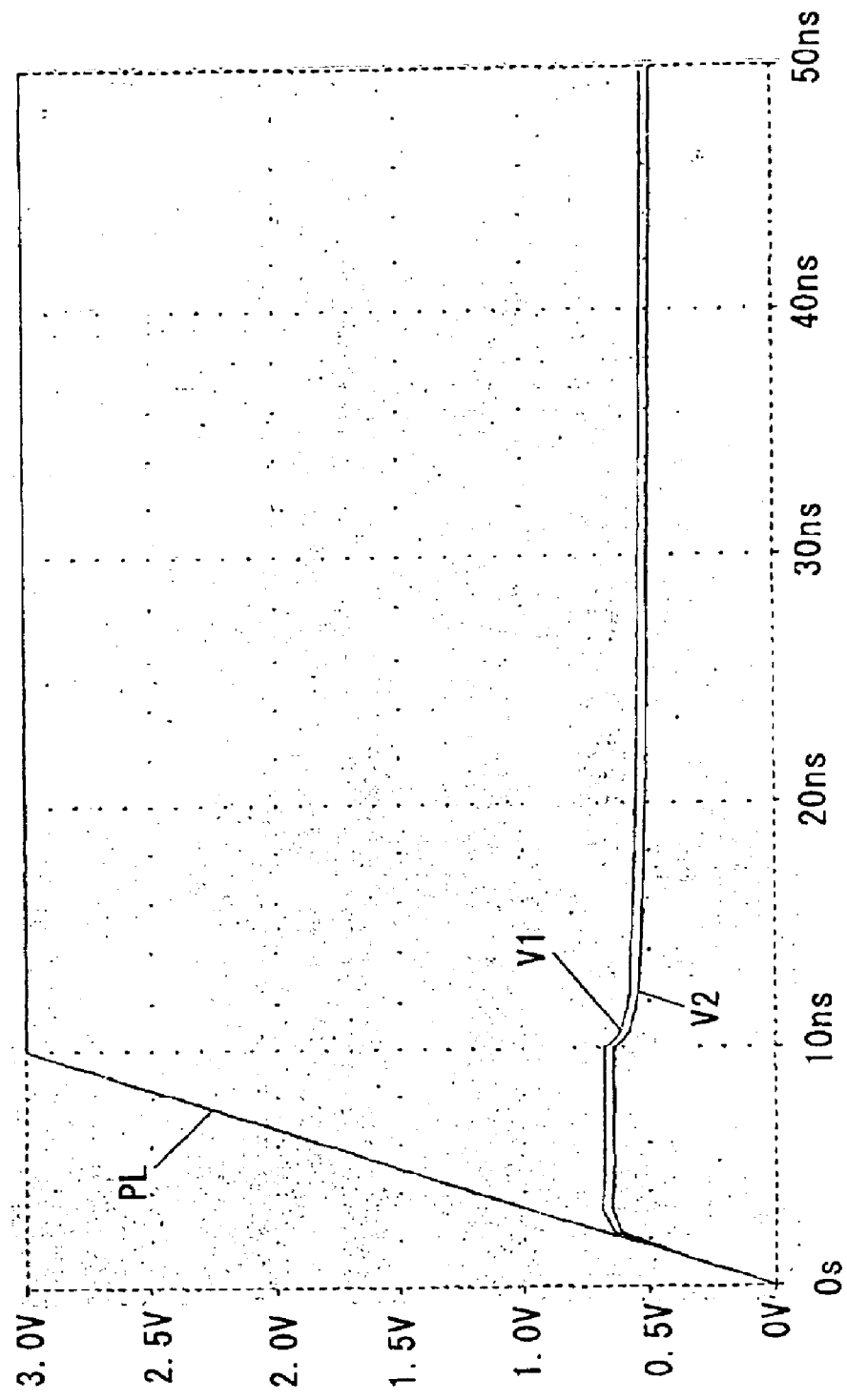
FIG. 13 shows voltages V1 and V2 produced at one end 911a of a ferroelectric capacitor 911 when data are read with the conventional circuit 909.

As seen FIG. 8, the difference between the voltages V1 and V2 is far greater than that obtained with the conventional arrangement (See FIG. 13). It is also seen that the difference between the voltages V1 and V2 is already considerably great before the voltage of the plate line PL reaches the power supply voltage VDD (3 volts in this example).

Therefore, signal detection margin is very large when data are restored, and operational stability is very high. Since the signal detection margin is very large when data are restored, it is possible to use ferroelectric capacitors of a small capacity. Therefore, decrease in the operation speed of the data latch circuit 33 is restricted. The large signal detection margin at the time of restoring data also makes it possible to apply the power supply voltage VDD to the power supply line VDD before the rise of the reading signal 83 shown in FIG. 7 is complete (earlier than the time point of 85 in FIG. 7). As a result, data restoring time may be shortened.

While the embodiment shown in FIG. 5 is arranged that the plate line PL is energized after energizing the well voltage control line Vs, it may be arranged that the two lines are energized simultaneously. The point is that it suffices for the purpose if the power supply voltage VDD is already applied to the well region when electric charge is released at the electric charge releasing node.

The embodiment shown in FIG. 5 is also arranged that the well regions of all the p-MOSFETs 39, 45, and 51 connected to the electric charge releasing node are connected to the well voltage control line Vs. Connecting the well regions of all the p-MOSFETs 39, 45, and 51, connected to the electric charge releasing node, to the well voltage control line Vs makes it possible to make data detection margin very large because the outflow of the electric charge released to the electric charge releasing node is almost perfectly prevented. However, this invention is not limited to that arrangement.

The embodiment shown in FIG. 5 is also arranged that one end 17a of the ferroelectric capacitor 17 is interposed between the inverter circuit 43 and the transfer gate 49. However, this invention is not limited to that arrangement.

For example, it may be arranged to interpose one end 17a of the ferroelectric capacitor 17 between the output node of the transfer gate 49 and the input node of the inverter circuit 37. Besides, an arrangement without the transfer gate 49 is also possible. That is to say, the output node of the inverter circuit 43 and the input node of the inverter circuit 37 are interconnected not through the transfer gate 49 but directly. In such an arrangement, it is preferable to connect the well region of the p-MOSFET constituting the transfer gate 15 to the well voltage control line Vs.

Although not shown, in the case the data output line Q is connected to an output node of an inverter circuit or a transfer gate, it is preferable to connect well regions of p-MOSFETs that constitute such inverter or transfer gate to the well voltage control line Vs.

The embodiment shown in FIG. 5 is also described as an example of using the paired ferroelectric capacitors to form the ferroelectric memory section 5. However, this invention is not limited to the above. For example, this invention may also be applied to an arrangement with a single ferroelectric capacitor used as the ferroelectric memory section.

The embodiment shown in FIG. 5 is also described as an example using a kind of sequential circuit, the data latch circuit, as a data holding circuit. However, this invention is not limited to the above. For example, this invention may be applied to other sequential circuits such as the flip-flop circuit. Besides, in addition to the sequential circuit, the memory circuit may also be enumerated as the data holding circuit to which this invention may be applied.

While an example arrangement including a pair of inverter circuits that can be connected in a series loop is described above as a data holding circuit, the data holding circuit is not limited to the above. The present invention may also be applied to any circuit that can hold data in volatile manner.

Although the embodiment shown in FIG. 5 is also described as an example of data storing circuit provided with ferroelectric capacitors, the data storing circuit is not limited to the above. In essence, the data storing circuit related to the present invention may be any circuit as long as it releases an amount of electric charge commensurate with the stored data to the electric charge releasing node when a reading signal is applied.

The embodiment shown in FIG. 5 is also described as an example of using p-MOSFETs as field effect transistors, the present invention is not limited to the above. For example, in the case the electric charge released at the electric charge releasing node is negative, an n-MOSFET corresponds to the field effect transistor related to the invention.

While each of the above embodiments is arranged that the ferroelectric storage section stores the polarized state corresponding to the data immediately before the power supply is shut off, it may also be arranged that the ferroelectric storage section stores the polarized state corresponding to the data at any time point.

Figure 9:
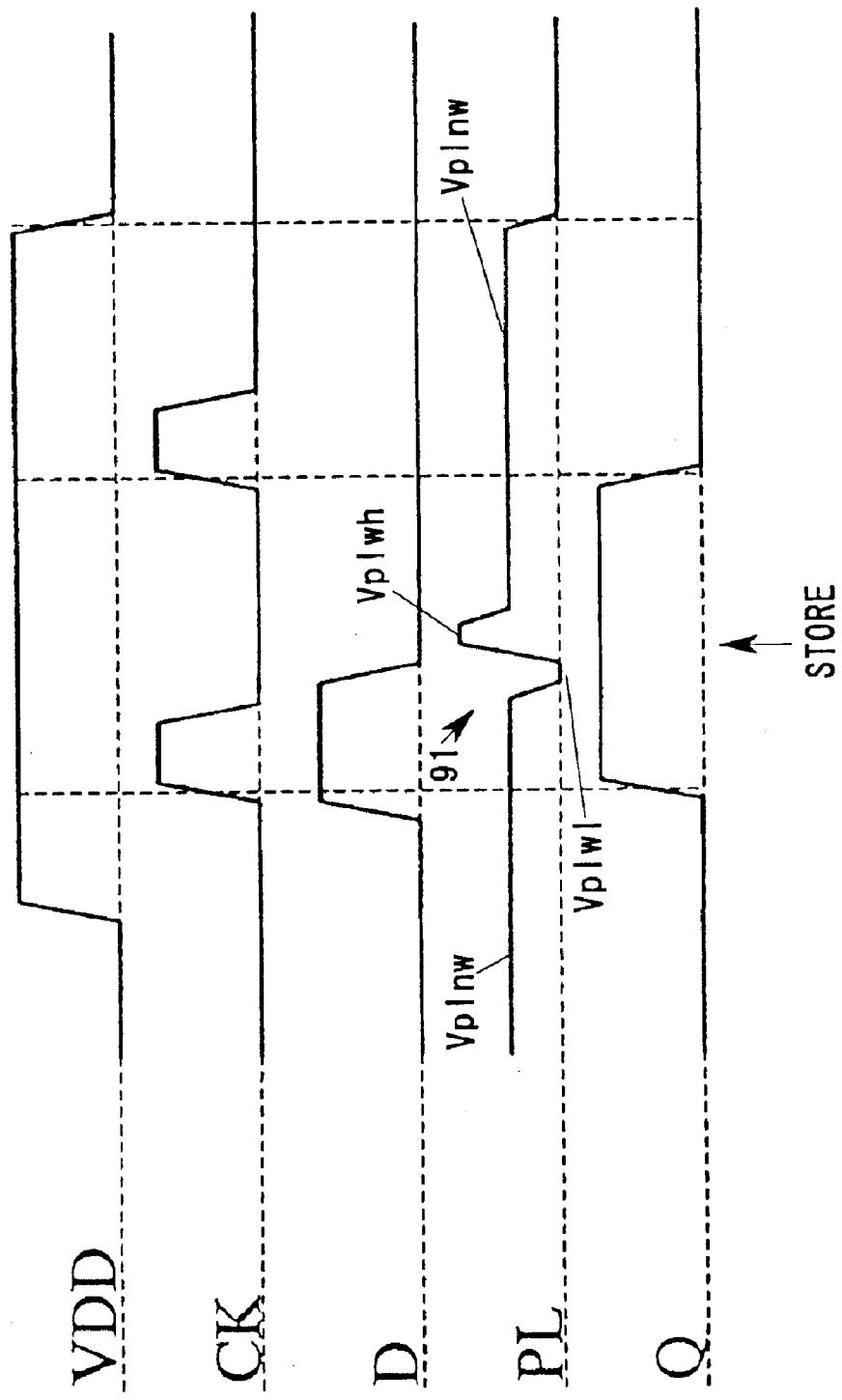
FIG. 9 is a timing chart for explaining the function of the data holding device as another embodiment of the present invention when data is stored.

FIG. 9 is an example timing chart of the ferroelectric storage section storing the polarized state corresponding to the data at any time point. Referring to FIG. 9, the function of the data holding device when data is stored (written) will be described.

As described before, the examples shown in FIG. 2 and FIG. 7 are arranged that in normal function the plate line PL is held at the ground potential GND and a writing signal 81 (a pulse signal with its bottom end potential at the ground potential GND and its top end potential at the power supply voltage VDD) is given to the plate line PL just before shutting off the power supply.

However, the example shown in FIG. 9 is arranged that in normal function the plate line PL is held at a predetermined voltage (non-writing plate voltage Vplnw) between the ground potential GND and the power supply voltage VDD and a writing signal 91 is given to the plate line PL at any time point.

The writing signal 91 is made up of at least a pair of writing plate low voltage Vplwl and a writing plate high voltage Vplwh. The writing plate low voltage Vplwl is lower than the non-writing plate voltage Vplnw while the writing plate high voltage Vplwh is higher than the non-writing plate voltage Vplnw.

In order for the ferroelectric capacitors 17 and 19 in the example shown in FIG. 9 are not inverted in polarity during normal functioning, the relationship between the non-writing plate voltage Vplnw and the resistant voltage Vc of the ferroelectric capacitors 17 and 19 should be set as follows:

Power supply voltage VDD−Vplnw<Vc and Vplnw−Ground voltage GND<Vc

For example, the above relationship is established by determining the non-writing plate voltage Vplnw and the resistant voltage Vc of the potential ferroelectric capacitors 17 and 19 so that Vplnw=(VDD−GND)/2<Vc.

On the other hand, in order for the ferroelectric capacitors 17 and 19 in the example shown in FIG. 9 are inverted in polarity during writing data, the relationship between the writing plate low voltage Vplwl and the resistant voltage Vc of the potential ferroelectric capacitors 17 and 19, and the relationship between the writing plate high voltage Vplwh and the resistant voltage Vc should be set respectively as follows:

Power supply voltage VDD−Vplwl>Vc and Vplwh−Ground voltage GND>Vc

For example, the above relationship is established by determining the writing plate low voltage Vplwl, the writing plate high voltage Vplwh, and the resistant voltage Vc of the potential ferroelectric capacitors 17 and 19 so that Vplwl= GND, Vplwh=VDD, and VDD>Vc.

The example shown in FIG. 9 may be adapted for example that the data of the data holding circuit at the moment when an error occurs (or just before that) is stored in the ferroelectric section 5. In this way it is possible to store selectively the data of a high reliability at the time of the error (or just before that) rather than of a low reliability after the error. Therefore, it is possible to resume the processing from a point of a high reliability when the power supply is turned on.

Incidentally, the data restoring function of the arrangement shown in FIG. 9 is the same as that of the example shown in FIG. 2 or 7. An arrangement for use as the data holding device in the example shown in FIG. 9 may also be the same as the data holding device used in the examples shown in FIGS. 2 and 7 except for the relationship between the resistant voltage Vc of the ferroelectric capacitors 17, 19 and the voltage value applied to the plate line PL, and for the functioning at the time of storing data as described above.

While each of the above embodiments is arranged that the data held in the data holding circuit be stored in the ferroelectric storage section, it may also be arranged that the data that is passing through the data holding device be stored in the ferroelectric storage section. The point is that the data present in the data holding device be stored in the ferroelectric circuit.

While each of the above embodiments is arranged that a writing signal be given to the other end of the first ferroelectric capacitor or the first and second ferroelectric capacitors in order to store the polarized state corresponding to the data present in the data holding circuit, the invention is not limited to that arrangement.

The point of the arrangement is that the polarized state corresponding to the data present in the data holding device be stored in the first ferroelectric capacitor or in the first and second ferroelectric capacitors on the basis of the potential at the other end relative to the one end of the first ferroelectric capacitor or the first and second ferroelectric capacitors.

Figure 10:
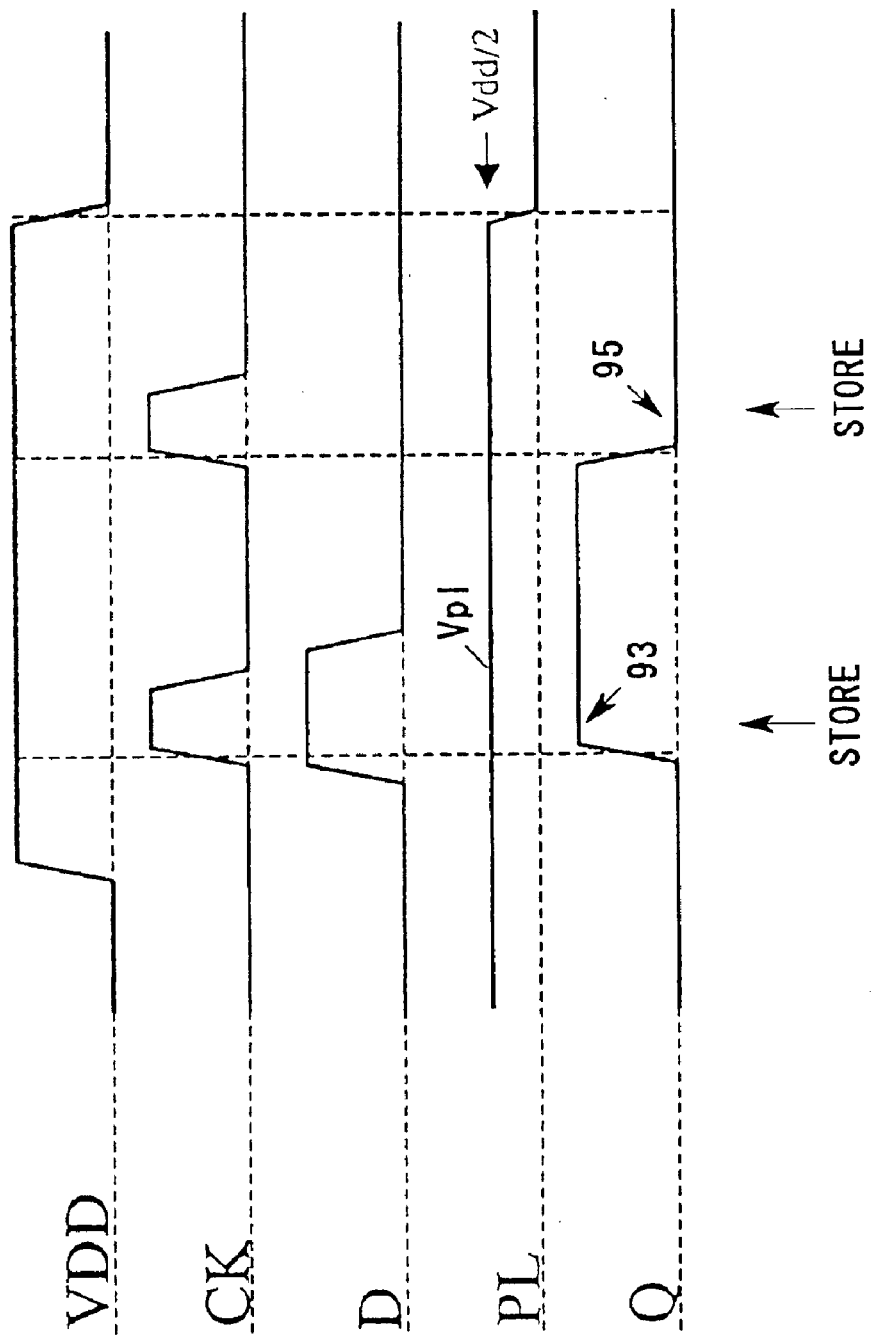
FIG. 10 is a timing chart for explaining the function of the data holding device as still another embodiment of the present invention when data is stored.
Figure 11:
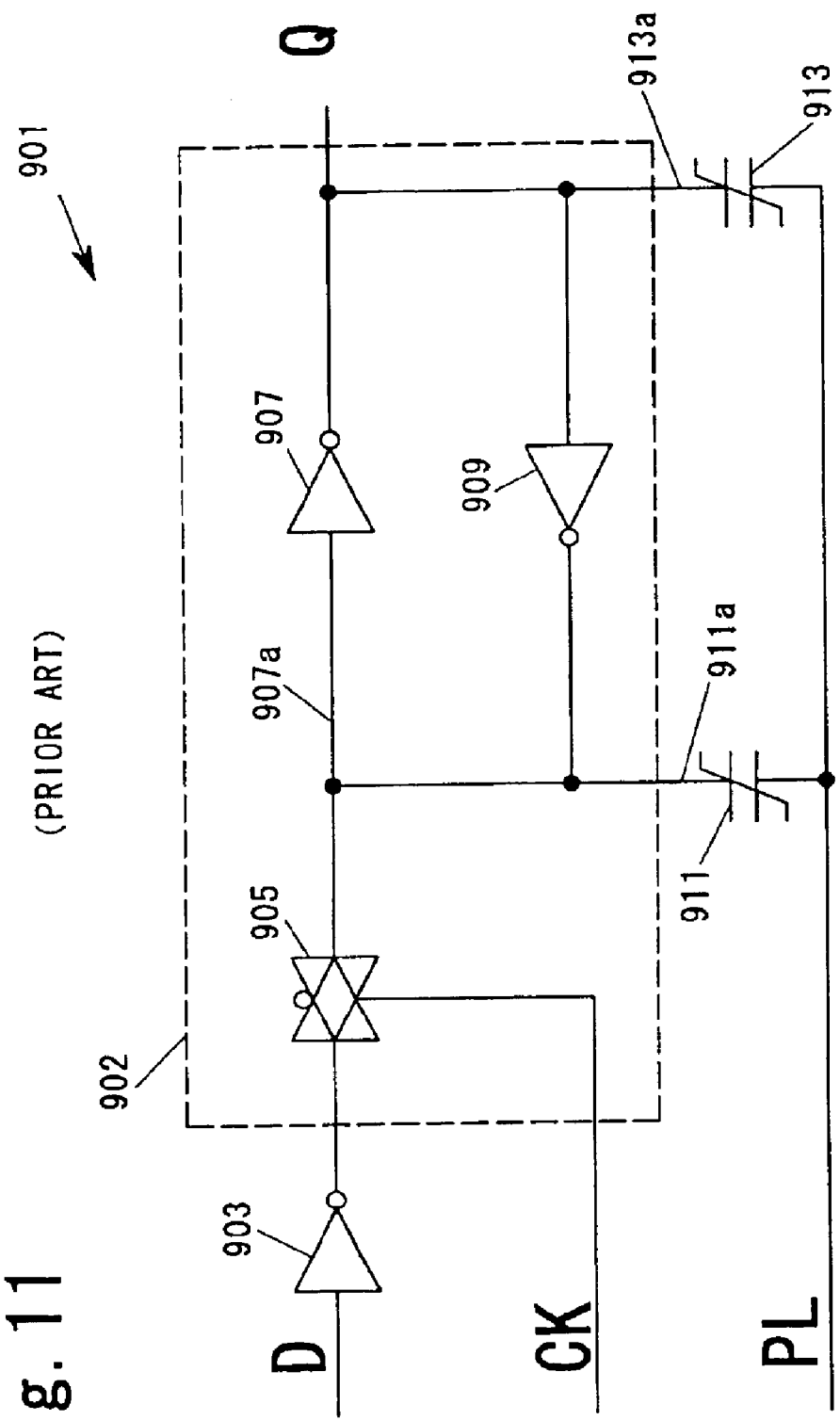
FIG. 11 shows a conventional circuit 901 using ferroelectric capacitors.
Figure 12A:
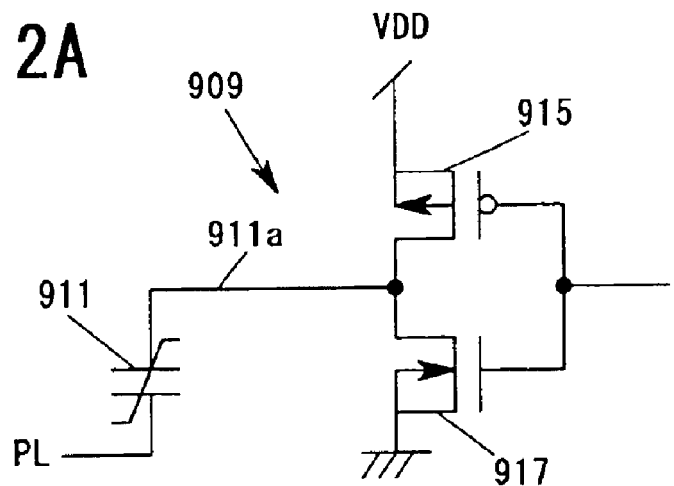
FIG. 12A shows an inverter circuit 909 constituting the conventional circuit 901.
Figure 12B:
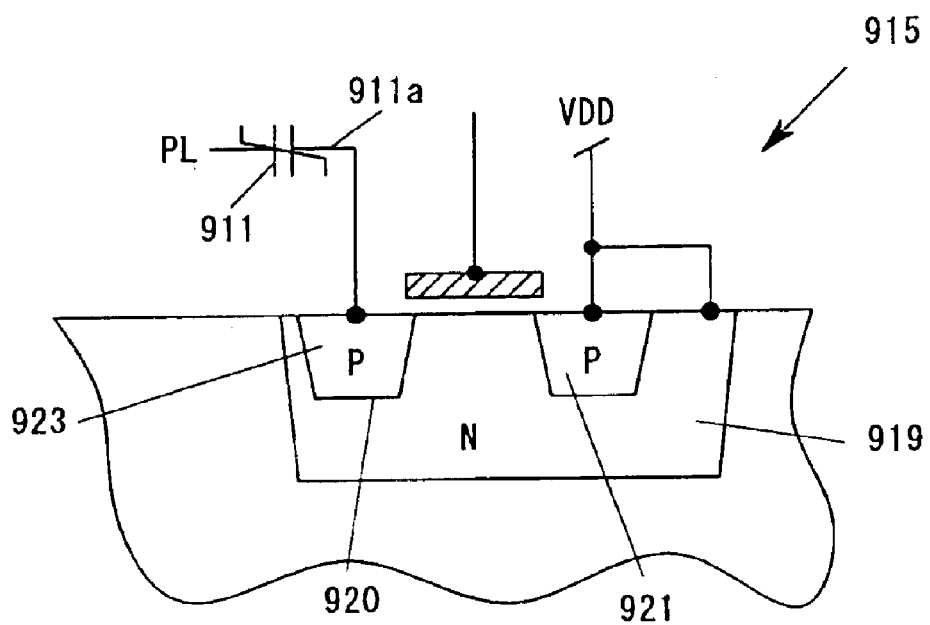
FIG. 12B is a schematic view in actual form showing a p-MOSFET 915 constituting the inverter circuit 909.

FIG. 10 is an example timing chart of an arrangement that always stores in the ferroelectric storage section the polarized state corresponding to the data present in the data holding circuit by simply giving a predetermined plate line voltage Vpl to one end of the first ferroelectric capacitor or of the first and second ferroelectric capacitors. Referring to FIG. 10, function of the data holding device in storing (writing) data will be explained.

As described above, the examples shown in FIGS. 2, 7, and 9 is arranged to write the data of the data holding circuit into the ferroelectric storage section by giving to the plate line PL a writing signal 81 or 91 that is different from the signal used in normal functioning.

However, the example shown in FIG. 10 is arranged to continue giving to the plate line PL a constant plate line voltage Vpl that is the same as that in normal functioning also when writing the data of the data holding circuit into the ferroelectric storage section.

In the example shown in FIG. 10, in order for the ferroelectric capacitors 17 and 19 to be inverted in polarity every time the data of the data holding circuit or the output data Q changes, the plate line voltage Vpl and the resistant voltage Vc of the ferroelectric capacitors 17 and 19 should be set in the following relationship:

Power supply voltage VDD–Vpl>Vc and Vpl–Ground voltage GND>Vc

The above relationship is established by determining for example the plate voltage Vpl and the resistant voltage Vc of the ferroelectric capacitors 17 and 19 so that for example Vc<Vpl=(Power supply voltage VDD–Ground potential GND)/2.

With the above constitution in reference to FIG. 10, when the output data Q of the data holding circuit changes from the ground potential GND to the power supply voltage VDD (Refer to 93 in FIG. 10), the directions of polarization of the ferroelectric capacitors 17 and 19 are automatically inverted. When the output data Q of the data holding circuit changes from the power supply voltage VDD to the ground potential GND (Refer to 95 in FIG. 10), the directions of polarization of the ferroelectric capacitors 17 and 19 are automatically inverted again.

In other words, the polarized state corresponding to the data present in the data holding circuit can be always stored in the ferroelectric storage section simply by giving to the plate line PL the constant plate line voltage Vpl. Therefore, even if a writing signal is not specially given, it is possible to store in the ferroelectric storage section the polarized state corresponding to the data present in the data holding circuit immediately before the power supply is shut off.

Incidentally, the data restoring function with the arrangement shown in FIG. 10 is the same as with the example shown in FIG. 2 or 7. The data holding device for use in the example shown in FIG. 10 may be the same in constitution as the examples shown in FIG. 2 and FIG. 7 except for the relationship between the resistant voltage Vc of the ferroelectric capacitors 17 and 19 and the voltage value applied to the plate line PL, and for the functioning at the time of storing data as described above.

The data holding device according to the present invention is the one having a data holding circuit made to be capable of holding data by interconnecting in a series loop an inverter circuit disposed on a main signal path and an inverter circuit disposed on a feedback circuit, and comprising:

a first on-off gate disposed between an output node of the inverter circuit disposed in the feedback path and an input node of the inverter circuit disposed in the main signal path and on-off-controlled to become on state when holding data and to become off state when passing data; and a first ferroelectric capacitor with its one end connected to the output node of the inverter circuit disposed in the feedback path, and adapted to cause the first ferroelectric capacitor, by giving a writing signal to the other end of the first ferroelectric capacitor, to memorize a polarized state corresponding to the data held in the data holding circuit, and to cause the data holding circuit, by giving a reading signal to the other end, to restore the data corresponding to the polarized state memorized in the first ferroelectric capacitor.

Therefore, since the first on-off gate becomes off when data are passed, the input node of the inverter circuit disposed on the main signal path is disconnected from the first ferroelectric capacitor. As a result, the potential of the input node of the inverter circuit disposed on the main signal path changes quickly with the change in the input data without being affected with the capacity of the first ferroelectric capacitor.

In other words, a data holding device is provided that can hold data even if power supply is stopped and that is highly reliable in holding data in operation at high speeds.

Since the first on-off gate has also the function of preventing concurrence of input data and feedback data at the input node of the inverter circuit disposed on the main signal path, a data holding device is realized using a small number of components and having high performance.

Since the clock pulses for switching between the states of holding data and passing data may be used as the signal for on-off-controlling the first on-off gate, no dedicated signals need to be produced. Thus, the entire circuit constitution is simplified.

Since the change in the input data at the time of passing data does not cause the polarized state of the first ferroelectric capacitor to change, deterioration of the first ferroelectric capacitor due to the change in the polarized state is restricted.

The data holding device according to the present invention having a second ferroelectric capacitor with its one end connected to the input node of an inverter circuit disposed in the feedback path is arranged to cause the first and second ferroelectric capacitors to memorize the polarized state corresponding to the data held in the data holding circuit by giving the writing signal to the other end and to cause the data holding circuit to restore data corresponding to the polarized state memorized in the first and second ferroelectric capacitors by giving the reading signal to the other end.

Since the polarized states corresponding to the data held in the data holding circuit are stored in the two ferroelectric capacitors respectively and the data are restored on the basis of the polarized states, reliability in data restoration is high.

The data holding device according to the present invention having a second on-off gate controlled to be on when holding data and to be off when passing data, and a second ferroelectric capacitor with its one end connected to the input node of an inverter circuit disposed in the feedback path, arranged to cause the first and second ferroelectric capacitors to memorize the polarized state corresponding to the data held in the data holding circuit by giving the writing signal to the other end of the first and second ferroelectric capacitors, and to cause the data holding circuit to restore the data corresponding to the polarized state memorized in the first and second ferroelectric capacitors by giving the reading signal to the other ends.

Since the polarized states corresponding to the data held in the data holding circuit are stored in the two ferroelectric capacitors respectively and the data are restored on the basis of the polarized states, reliability in data restoration is high.

Since the second on-off gate becomes off when data are passed, the input node of the inverter circuit disposed on the feedback path is disconnected from the second ferroelectric capacitor. Therefore, the output of the inverter circuit disposed on the main signal path quickly reaches the input node of the inverter circuit disposed on the feedback circuit.

As a result, data are determined quickly when the data passage state shifts to the data holding state.

Since the clock pulses for switching between the states of holding data and passing data may be used as the signal for on-off-controlling the second on-off gate, like the signal for on-off-controlling the first on-off gate, no dedicated signals need not be produced. Thus, the entire circuit constitution is simplified.

Since the change in the input data at the time of passing data does not cause the polarized state of the second ferroelectric capacitor to change, deterioration of the second ferroelectric capacitor due to the change in the polarized state is restricted.

The data holding device according to the present invention is the one comprising:

a data storing circuit that, releases to an electric charge releasing node the amount of charge matching the stored data when a reading signal is given;

a data restoring circuit that restores, based on a voltage produced at the electric charge releasing node by the released charge, contents of data stored in the data storing circuit; and a field effect transistor that has a drain region substantially connected to the electric charge releasing node and also has a junction joining direction of which from the drain region to a base semiconductor region is in agreement with a charge releasing direction, and adapted to start giving a voltage that is substantially the same as a source voltage that is to be given to a source region of the field effect transistor to the base semiconductor region either simultaneously with or before giving a reading signal to the data storing circuit, and to give the source voltage to the source region after giving the reading signal to the data storing circuit.

Since a voltage that is substantially the same as the source voltage is already given to the base semiconductor region of the field effect transistor when electric charge is released by giving a reading signal to the data storing circuit, the released electric charge cannot flow out to the base semiconductor region. Therefore, a voltage corresponding to the released electric charge is produced at the electric charge releasing node of the data storing circuit.

In other words, even in the case the power supply must be made to the field effect transistor after giving a reading signal to the data storing circuit, since electric charge collects at the electric charge releasing node, it is possible to securely restore the contents of data stored in the data storing circuit by means of the data restoring circuit.

In the data holding device according to the present invention, the data storing circuit has a ferroelectric capacitor, the electric charge releasing node is one end of the ferroelectric capacitor, the reading signal is given to the other end of the ferroelectric capacitor, and the data restoring circuit is a first inverter circuit with its input node connected to the electric charge releasing node, and a second inverter circuit having the field effect transistor is provided with its input node connected to an output node of the first inverter circuit and with its output node connected to the electric charge releasing node.

In the case the data stored in the ferroelectric capacitor are to be restored in the data holding circuit made up by interconnecting the first and second inverter circuits in a series loop, concurrence of the electric charge released from the ferroelectric capacitor to the electric charge releasing node and the output of the second inverter circuit can be prevented by giving a reading signal under the condition of power supply to the second inverter circuit stopped. In that case too, the electric charge released to the electric charge releasing node is prevented from flowing out to the base semiconductor region of the field effect transistor constituting the second inverter circuit. Therefore, signal detection margin is very large when data are restored, and operational stability is very high.

Since the signal detection margin is very large when data are restored, it is possible to use ferroelectric capacitors of a small capacity. Therefore, the decrease in the operation speed of the data holding circuit is restricted.

The large signal detection margin at the time of restoring data also makes it possible to shorten the duration of giving the reading signal or to advance the timing of supplying the source voltage to the second inverter circuit. As a result, data restoring time may be shortened.

Incidentally, the term "base semiconductor region" as used in claims and specification refers to the semiconductor region of the conduction type which is different from that of the source and drain regions, and in which the source and drain regions are directly formed. In the embodiment, the well region of the p-MOSFET corresponds to that region.

While preferable example embodiments of the present invention are described above, the respective terms are used not for limitation but for illustration and may be changed within the scope of the appended claims without departing from the scope and the spirit of the present invention.

What is claimed is:

1. A data holding device with a data holding circuit made to be capable of holding data by interconnecting, in a series loop, an inverter circuit disposed in a main signal path and an inverter circuit disposed in a feedback path, comprising:

a first on-off gate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to a path between the output node of the inverter circuit disposed in the feedback path and the first on-off gate;

wherein a polarized state corresponding to the data held in the data holding circuit is memorized in the first ferroelectric capacitor by giving a writing signal to the other end of the first ferroelectric capacitor; and wherein the data corresponding to the polarized state memorized in the first ferroelectric capacitor is restored in the data holding circuit by giving a reading signal to the other end.

2. The data holding device according to claim 1, further comprising a second ferroelectric capacitor having its one end connected to the input node of the inverter circuit disposed in the feedback path;

wherein the polarized state corresponding to the data held in the data holding circuit is memorized in the first and second ferroelectric capacitors by giving the writing signal to the other ends of the first and second ferroelectric capacitors; and wherein the data corresponding to the polarized state memorized in the first and second ferroelectric capacitors is restored in the data holding circuit by giving the reading signal to the other ends.

3. The data holding device according to claim 2, wherein the inverter circuit disposed in the feedback path comprises a field effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

4. The data holding device according to claim 2, wherein the first on-off gate comprises a field effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

5. The data holding device according to claim 2, wherein each of the first on-off gate and the inverter circuit disposed in the feedback path comprises a field effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

6. The data holding device according to claim 2, wherein the inverter circuit disposed in the main signal path comprises a field effect transistor having a drain region connected to one end of the second ferroelectric capacitor and having a junction with its joining direction from the drain region to a base semiconductor region in agreement with a direction of an electric charge released to one end of the second ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

7. The data holding device according to claim 2, wherein each of the inverter circuit disposed in the feedback path and the first on-off gate comprises a field effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given, the inverter circuit disposed in the main signal path comprises a field effect transistor having a drain region connected to one end of the second ferroelectric capacitor and having a junction with its joining direction from the drain region to a base semiconductor region in agreement with a direction of an electric charge released to one end of the second ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

8. The data holding device according to claim 7, wherein the field effect transistor is of a p-MOS type.

9. A data holding device with a data holding circuit made to be capable of holding data by interconnecting, in a series loop, an inverter circuit disposed in a main signal path and an inverter circuit disposed in a feedback path, comprising:

a first on-off sate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to the output node of the inverter circuit disposed in the feedback path;

a second on-off gate being on-off-controlled to be on when data is held and to be off when data is passed, and a second ferroelectric capacitor having its one end connected through the second on-off gate to the input node of the inverter circuit disposed in the feedback path;

wherein the polarized state corresponding to the data held in the data holding circuit is memorized in the first and second ferroelectric capacitors by giving the writing signal to the other ends of the first and second ferroelectric capacitors; and wherein the data corresponding to the polarized state memorized in the first and second ferroelectric capacitors is restored in the data holding circuit by giving the reading signal to the other ends.

10. A data holding device with a data holding circuit made to be capable of holding data by interconnecting, in a series loop, an inverter circuit disposed in a main signal path and an inverter circuit disposed in a feedback path, comprising:

a first on-off rate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to the output node of the inverter circuit disposed in the feedback path;

wherein a polarized state corresponding to the data held in the data holding circuit is memorized in the first ferroelectric capacitor by giving a writing signal to the other end of the first ferroelectric capacitor; and wherein the data corresponding to the polarized state memorized in the first ferroelectric capacitor is restored in the data holding circuit by giving a reading signal to the other end;

wherein the inverter circuit disposed in the feedback path comprises a field effect transistor having a drain region connected to one end of the first ferroelectric capacitor and having a junction with its joining direction from the drain region to a base semiconductor region of the field effect transistor in agreement with a direction of an electric charge released to one end of the first ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

11. A data holding device with a data holding circuit made to be capable of holding data by interconnecting, in a series loop, an inverter circuit disposed in a main signal path and an inverter circuit disposed in a feedback path, comprising;

a first on-off sate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to the output node of the inverter circuit disposed in the feedback path;

wherein a polarized state corresponding to the data held in the data holding circuit is memorized in the first ferroelectric capacitor by giving a writing signal to the other end of the first ferroelectric capacitor; and wherein the data corresponding to the polarized state memorized in the first ferroelectric capacitor is restored in the data holding circuit by giving a reading signal to the other end;

wherein the first on-off gate comprises a filed effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

12. A data holding device with a data holding circuit made to be capable of holding data by interconnecting, in a series loop, an inverter circuit disposed in a main signal path and an inverter circuit disposed in a feedback path, comprising:

a first on-off sate disposed between an output node of the inverter circuit disposed in the feedback path and an input node of the inverter circuit disposed in the main signal path, the first on-off gate being on-off-controlled to be on when data is held, and to be off when data is passed; and a first ferroelectric capacitor having its one end connected to the output node of the inverter circuit disposed in the feedback path;

wherein a polarized state corresponding to the data held in the data holding circuit is memorized in the first ferroelectric capacitor by giving a writing signal to the other end of the first ferroelectric capacitor; and wherein the data corresponding to the polarized state memorized in the first ferroelectric capacitor is restored in the data holding circuit by giving a reading signal to the other end;

wherein each of the first on-off gate and the inverter circuit disposed in the feedback path comprises a field effect transistor having a drain region connected to one end of the first ferroelectric capacitor and having a junction with its joining direction from the drain region to a base semiconductor region in agreement with a direction of an electric charge released to one end of the first ferroelectric capacitor as the reading signal is given, and wherein a voltage substantially the same as a source voltage that is to be given to a source region of the field effect transistor is started to be given to the base semiconductor region either simultaneously with or before giving the reading signal; and the source voltage is given to the source region after giving the reading signal.

13. The data holding device according to claim 12, wherein the field effect transistor is of a p-MOS type.

14. A data holding device comprising:

a data storing circuit for releasing an amount of electric charge commensurate with stored data to an electric charge releasing node when a reading signal is given;

a data restoring circuit for restoring contents of the data stored in the data storing circuit on the basis of a voltage produced at the electric charge releasing node with the released electric charge; and a field effect transistor having a drain region connected substantially to the electric charge releasing node and having a junction with its joining direction from the drain region to a base semiconductor region of the field effect transistor in agreement with a direction of the electric charge released; and wherein a voltage substantially the same as a source voltage that is to be given to a source region of the field effect transistor is started to be given to the base semiconductor region either simultaneously with or before giving the reading signal; and the source voltage is given to the source region after giving the reading signal.

15. The data holding device according to claim 14, wherein the data storing circuit comprises a ferroelectric capacitor, the electric charge releasing node is one end of the ferroelectric capacitor, the reading signal is given to the other end of the ferroelectric capacitor, and the data restoring circuit is a first inverter circuit having an input node connected to the electric charge releasing node, and the data holding device further comprises a second inverter circuit including the field effect transistor and having an input and an output nodes, the former being connected to the output node of the first inverter circuit and the latter being connected to the electric charge releasing node.

16. The data holding device according to claim 15, wherein the field effect transistor is of a p-MOS type.

17. A data holding device having a data holding circuit made to be capable of holding data by interconnecting, in a series loop, an inverter circuit disposed in a main signal path and an inverter circuit disposed in a feedback path, comprising:

a first on-off gate disposed between the output node of the inverter circuit disposed in the feedback path and the input node of the inverter circuit disposed in the main signal path, the first on-off gate being on-off-controlled to become on state when data is held and to become off state when data is passed, and a first ferroelectric capacitor having its one end connected to the output node of the inverter circuit disposed in the feedback path, wherein the first ferroelectric capacitor is adapted to memorize the polarized state corresponding to the data present in the data holding circuit on the basis of the potential at the other end relative to the potential at one end of the first ferroelectric capacitor, and wherein the data holding circuit is adapted to restore the data corresponding to the polarized state stored in the first ferroelectric capacitor into the data holding circuit by giving a reading signal to the other end.

18. A method for reading data, using a data holding device having a data storing circuit for releasing an amount of electric charge commensurate with stored data to an electric charge releasing node when a reading signal is given; a data restoring circuit for restoring contents of the data stored in the data storing circuit on the basis of a voltage produced at the electric charge releasing node with the released electric charge; and a field effect transistor having a drain region connected substantially to the electric charge releasing node and having a junction with its joining direction from the drain region to a base semiconductor region of the field effect transistor in agreement with a direction of the electric charge released; the method comprising:

starting to give a voltage substantially the same as a source voltage that is to be given to a source region of the field effect transistor, to the base semiconductor region either simultaneously with or before giving a reading signal to the data storing circuit; and giving the source voltage to the source region after giving the reading signal, to the data storing circuit.

19. The data reading method according to claim 18, wherein the data storing circuit includes a ferroelectric capacitor, the electric charge releasing node is one end of the ferroelectric capacitor, the reading signal is given to the other end of the ferroelectric capacitor, and the data restoring circuit is a first inverter circuit having an input node connected to the electric charge releasing node, and the data holding device further comprises a second inverter circuit including the field effect transistor and having an input and an output nodes, the former being connected to the output node of the first inverter circuit and the latter being connected to the electric charge releasing node.

20. The data holding device according to claim 19, wherein the field effect transistor is of a p-MOS type.

* * * * *